United States Patent
Fujita

(10) Patent No.: US 9,444,444 B2
(45) Date of Patent: Sep. 13, 2016

(54) ANTI-RINGING TECHNIQUE FOR SWITCHING POWER STAGE

(71) Applicant: Analog Devices Global, Hamilton (BM)

(72) Inventor: Takashi Fujita, Edogawa-ku (JP)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 13/958,141

(22) Filed: Aug. 2, 2013

(65) Prior Publication Data

US 2015/0035584 A1 Feb. 5, 2015

(51) Int. Cl.
*H03K 17/16* (2006.01)
*H03K 17/042* (2006.01)

(52) U.S. Cl.
CPC ...... *H03K 17/165* (2013.01); *H03K 17/04206* (2013.01); *H03K 17/163* (2013.01); *H03K 17/166* (2013.01)

(58) Field of Classification Search
CPC ............. H03K 17/163; H03K 17/166; H03K 17/165; H03K 17/04206
USPC ........ 327/384, 108, 109, 110, 111, 112, 170, 327/374, 376, 377, 379, 380, 381, 403, 408, 327/409, 410, 427, 434
See application file for complete search history.

(56) References Cited

U.S. PATENT DOCUMENTS

| | | | |
|---|---|---|---|
| 5,550,458 A | 8/1996 | Farrington et al. | |
| 6,580,258 B2 | 6/2003 | Wilcox et al. | |
| 6,664,829 B1 * | 12/2003 | Hughes | 327/157 |
| 7,508,174 B2 | 3/2009 | Wei et al. | |
| 7,535,283 B2 | 5/2009 | Kojima | |
| 7,554,385 B2 * | 6/2009 | Ishida | 327/536 |
| 8,169,198 B2 | 5/2012 | Lin et al. | |
| 8,188,769 B2 | 5/2012 | Nishimura | |
| 8,633,755 B2 | 1/2014 | Kawamoto et al. | |
| 2011/0241738 A1 | 10/2011 | Tamaoka | |
| 2014/0084964 A1 * | 3/2014 | Kawamoto et al. | 327/108 |

FOREIGN PATENT DOCUMENTS

| | | |
|---|---|---|
| CN | 102208864 A | 10/2011 |
| CN | 102545555 A | 7/2012 |

OTHER PUBLICATIONS

M. Berkhout, "A 460W Class-D Output Stage with Adaptive Gate Drive," ISSCC Dig. Tech. Papers, pp. 452-453, Feb. 2009.
Chinese Application Serial No. 201410375495.6, Office Action mailed Jul. 20, 2016, (w/English Translation), 17 pgs.

* cited by examiner

*Primary Examiner* — Jung Kim
(74) *Attorney, Agent, or Firm* — Schwegman Lundberg & Woessner, P.A.

(57) ABSTRACT

A driver may provide a transition of a switch between an on state and an off state in two stages. In the first stage, the voltage slew rate of the voltage at an output terminal of the switch may be controlled. In the second stage, the current gradient of the switch may be controlled. The transition between the first stage and the second stage may be made based on the value of the voltage at the output terminal of the switch.

32 Claims, 6 Drawing Sheets

100

200

300

400

500

600

ANTI-RINGING TECHNIQUE FOR SWITCHING POWER STAGE

BACKGROUND

The present invention relates generally to driver circuits for output switches, and more specifically to driver circuits for reduced ringing in output switching voltage and reduced dead time when controlling multiple switches.

An output switch may be used to provide a switching voltage in response to a control signal from a driver circuit. The output switch may provide an output voltage that switches between a low switching voltage and a high switching voltage. The switching voltage transitions between these values in response to changing state (e.g., on and off states) of the switch. In practice, when the output switch is switched between the on and off states, the switching voltage is accompanied by spiking or ringing which may cause unwanted noise, over-voltage stress on the switch, or Electro-Magnetic Interference (EMI). Techniques and circuit are needed to reduce the unwanted spiking and ringing in the switching voltages.

Characteristics of the circuit or desired performance of the circuit can limit how fast the switches transition between the on and off states. However, it is desirable to have switches that transition quickly between these states. Thus, techniques are needed to improve the speed of switching between the on and off states of the switches while still providing the desired performance characteristics of the circuit.

BRIEF DESCRIPTION OF THE DRAWINGS

So that features of the present invention can be understood, a number of drawings are described below. It is to be noted, however, that the appended drawings illustrate only particular embodiments of the disclosure and are therefore not to be considered limiting of its scope, for the invention may encompass other equally effective embodiments.

DETAILED DESCRIPTION

Embodiment of the present invention may provide a driver for controlling a switch providing a switching voltage. The driver may provide a transition of a switch between an on state and an off state in two stages. In the first stage, the voltage slew rate of the voltage at an output terminal of the switch may be controlled. In the second stage, the current gradient of the switch may be controlled. The transition between the first stage and the second stage may be made based on the value of the voltage at the output terminal of the switch.

Such a circuit or method may improve the speed of the voltage slew rate, reduce spiking in the switching voltage, improve efficiency, reduce EMI and/or improve the speed of the switch. In addition, the dead time between switching multiple switches may be reduced by cross-conduction technique based on the nature of the current in one switch being decided by the current in another switch.

Figure 1A:
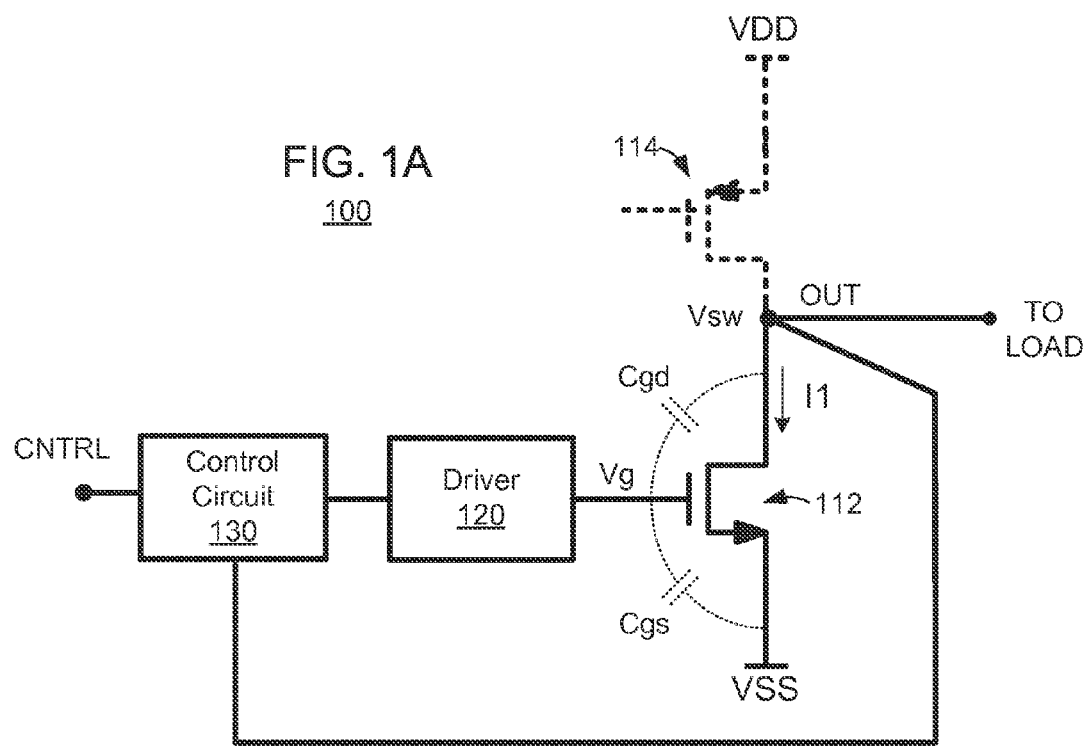
FIGS. 1A and 1B illustrate an exemplary switching circuit and graphs of values within the switching circuit according to an embodiment of the present invention.

FIG. 1A illustrates an exemplary switching circuit 100 according to an embodiment of the present invention. The switching circuit 100 may include a switch 112, a driver 120, and a control circuit 130. The driver 120 may have a control output coupled to a control input of the switch 112. The control circuit 130 may have a control output coupled to a control input of the driver 120. The switch 112 may be provided in a conductive path between a pair of reference voltages, shown as VDD and VSS.

In the embodiment illustrated in FIG. 1A, the switch 112 is illustrated as a PMOS transistor and VDD is a voltage that is higher than VSS. Other device types may be used (e.g., NMOS), in which case the relatively orientation of VDD and VSS might be reversed. The control circuit 130 and driver 120 may cooperate to control transition of the switch 112 between the on state and the off state according to the two stages.

As illustrated in FIG. 1A, the switch 112 may have an output terminal OUT that is coupled to a load device. In the example of FIG. 1A, the load device is coupled to the switch 112 at its drain. The load may be an inductive load such as a speaker or a motor. The switch 112 may be connected directly to the reference voltages VDD and VSS or, alternatively, may be one of many components provided in a VDD–VSS path. For example, other switches 114 may be provided in the VDD–VSS path.

The control circuit 130 may provide control signals to the driver 120 to drive the switch 112. The state of the switch 112 may regulate the switching voltage Vsw at the output terminal OUT and current flow through the switch 112. The voltage at the output terminal OUT may be provided to the load coupled to the switch via the output terminal OUT. The output terminal OUT may also be coupled to the control circuit 130 and the control circuit 130 may control the driver 120 based on the voltage Vsw at the output terminal OUT. The voltage Vsw at the output terminal OUT may fluctuate with changing states of the switch 112, changing states of other switches (e.g., switch 114) and/or operating characteristics of the load.

The switch 112 may be a large power device, which has a switching speed that is slower than speeds of components within the control circuit 130 and driver 120. The size of switch 112 may be decided by the on resistance requirements for the particular application (e.g., 100 mohm or 50 mohm). The components within the control circuit 130 and/or driver 120 may be scaled based on the size of switch 112. In one embodiment, the transistors in the control circuit 130 may have 1 μm-10 μm gate width, the transistors in the driver 120 may have 10 μm-1000 μm gate width, and switch 112 may have 10,000 μm-200,000 μm gate width. In one embodiment, a ratio of the transistors in the control circuit 130 to the switch 112 may be between one to 10,000 and one to 100,000. A ratio of the transistors in the driver 120 to the switch 112 may be between one to 1,000 and one to 10,000. Thus, processing circuitry within the control circuit 130 and driver 120 may respond to changing conditions at the output terminal OUT and control operation of the switch 112 as described below.

The control voltage Vg applied at the control input terminal of switch 112 may control the state of the switch. The characteristics of the control voltage Vg (e.g., driver strength) may affect the operating characteristics of the switch 112. For example, the control voltage Vg may affect the speed and/or efficiency of the switch 112. In addition, the control voltage Vg may affect the characteristics of the switching waveform Vsw generated at the output terminal. The timing and value of the control voltage Vg may help control spiking or ringing in the switching waveform Vsw which can cause unwanted noise, over-voltage stress to the devices, or Electro-Magnetic interference (EMI).

To control one or more of these characteristics while transitioning between the "on" state and the "off" state of the switch 112, the driver 120 may be controlled by the control circuit 130 to provide the control voltage Vg in two stages. Each stage may be controlled independently to provide desired switch 112 performance and/or switching voltage Vsw. In the first stage, the driver 120 may control the control voltage Vg by providing a first driver strength. In the second stage, the driver 120 may control the control voltage Vg by providing a second driver strength. The control circuit 130 may switch between the first stage and the second stage based on the voltage value Vsw at the output terminal OUT. For example, the driver 120 may be controlled to transition between the first stage and the second stage when the switching voltage Vsw reached a predetermined switching value.

The voltage provided at the gate of switch 112 may be based on the driver strength (e.g., on resistance of driver 120) and the capacitance of the switch 112. During a transition from an "on" stage to an "off" stage, the driver 120 may drive the gate-to-drain capacitance Cgd of switch 112 in the first stage. In the second stage, the driver 120 may drive the gate-to-source capacitance Cgs of the switch 112. The capacitances Cgd and Cgs may have different values while the switch 112 is in the saturation region. The driver 120 may provide different driver strength during each stage of the transition between the "on" state and the "off" state of the switch 112 to control the performance of the switch 112.

Figure 1B:
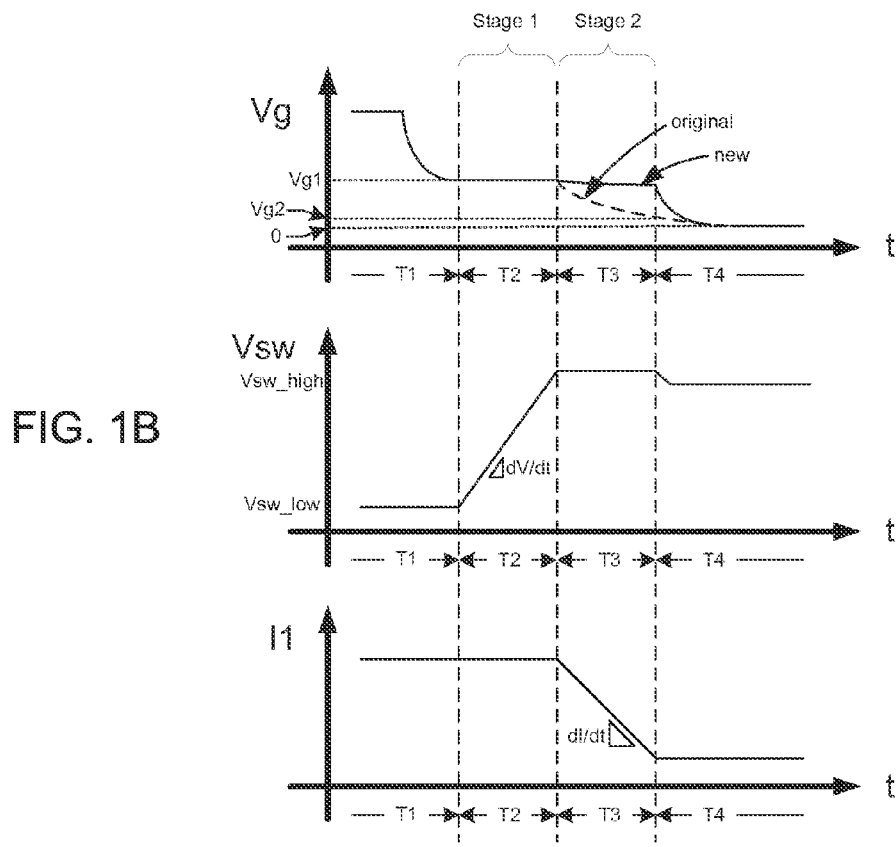

FIG. 1B illustrates voltage and current graphs of the circuit 100 for a transition from an "on" state to an "off" state according to an embodiment of the present invention. As shown in FIG. 1B, during the transition from an "on" state to an "off" state, the voltage Vsw at the output terminal OUT may change from a low voltage value (e.g., ground VSS) to a high voltage value (e.g., reference voltage VDD). Similarly, current I1 flowing into the switch 112 may stop when the switch is in the "off" state.

During period T1, the driver 120 may provide a high control voltage Vg that is sufficient to maintain the switch 112 in the "on" state. While the switch 112 is in the "on" state, current I1 may flow via switch 112 and the voltage potential VSS may be coupled the output terminal OUT. Even if the control voltage Vg is reduced by the driver 120, the switch 112 may continue to provide a current path for current I1 while the switch 112 is in the saturation region (e.g., control voltage Vg is above a threshold voltage of the switch 112).

During period T2, the driver 120 may reduce the control voltage Vg to a first predetermined value Vg1 to allow the voltage Vsw at the output terminal OUT to increase to a high voltage value (e.g., reference voltage VDD). The driver 120 may hold the control voltage Vg at the first predetermined value Vg1 during period T2. Holding the control voltage Vg at the first predetermined value Vg1 during period T2, may allow the driver 120 to discharge the gate-to-drain capacitance Cgd (shown in phantom in FIG. 1A) of the switch 112, while allowing the current I1 to flow into the switch 112 because the switch 112 may still be in the saturation region. The first predetermined value Vg1 may be selected to maintain the switch 112 in saturation and to have a desired voltage slew rate dV/dt of the voltage Vsw at the output terminal OUT. Controlling the slew rate dV/dt of the voltage Vsw may improve the efficiency and/or the EMI performance of the circuit.

During period T3, the driver 120 may further reduce the value of the control voltage Vg. Further reduction of the control voltage Vg may reduce the current I1 flowing into the switch 112 and stop the current I1 flowing into the switch 112 when the control voltage Vg reaches the second predetermined value Vg2. The driver 120 may control the control voltage Vg to provide a desired current gradient dI/dt of the current I1. Controlling the gradient dI/dt of the current I1 may reduce the spiking or ringing of the voltage Vsw. If the driver 120 provides the same driver strength in the second stage, the control voltage Vg shown with the "original" label may be provided at the gate of the switch 112. If the driver 120 changes the driver strength in the second stage, the control voltage Vg shown with the "new" label may be provided at the gate of the switch 112.

Because during period T3 the driver 120 may drive the gate-to-source capacitance Cgs of the switch 112, which during saturation is different from the gate-to-drain capacitance Cgd, providing the same driver strength period T2 and T3 may quickly reduce the value of the control voltage Vg, as shown with the "original" label. To independently control the control voltage Vg during period T3, a different driver strength may be provided during period T3 to drive the gate-to-source capacitance Cgs.

During period T4, the driver 120 may maintain the control voltage Vg at or below the second predetermined value Vg2 to keep the switch in the "off" state. The second predetermined value Vg2 may be the threshold voltage of the switch 112.

As discussed above, the control circuit 130 may monitor the voltage Vsw at the output terminal OUT, to select when the driver 120 should switch between stage 1 and stage 2. As shown in FIG. 1B, the driver 120 may switch between stage 1 and stage 2 when the voltage Vsw at the output terminal OUT reaches a predetermined switching voltage (e.g., reference voltage VDD).

During the switch between the stages, the driver 120 may change the driver strength. Different devices may be activated in the driver 120 during stage 1 and during stage 2 to provide the voltages in the respective stage. The different devices may provide an effective impedance at the control terminal of switch 112 that is different in each of the stages. For example, one or more devices from a first set of devices in the driver 120 may be activated during stage 1 to control the voltage slew rate dV/dt of switching voltage Vsw and one or more devices from a second set of devices in the driver 120 may be activated to control the current gradient dI/dt of the current I1. Thus, the voltage slew rate dV/dt of switching voltage Vsw and the current gradient dI/dt of the current I1 may be controlled individually by selecting which devices in the driver 120 are activated in each of the stages.

Figure 2B:
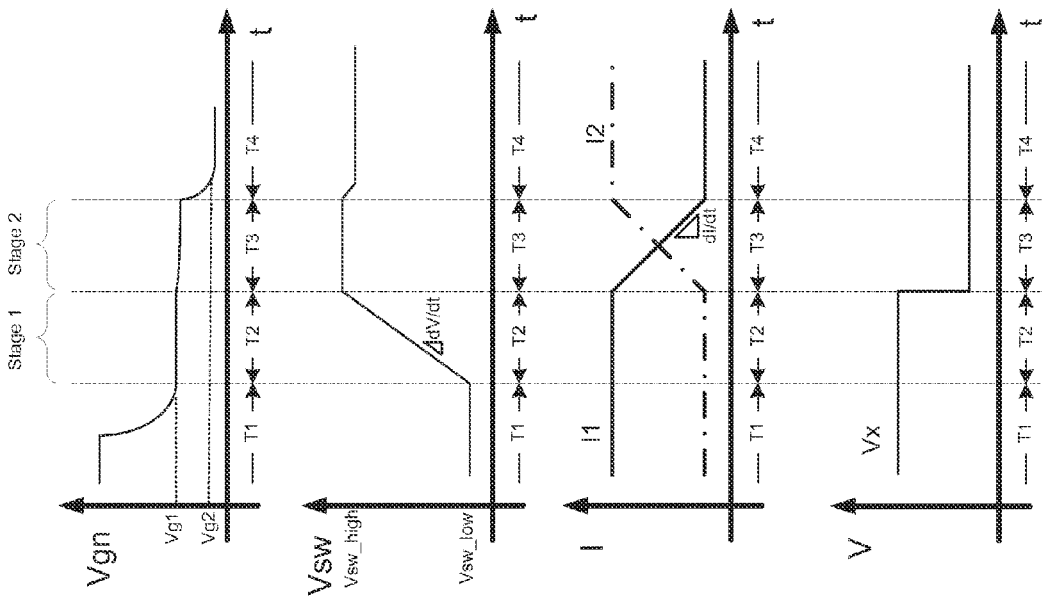
FIGS. 2A and 2B illustrate an exemplary switching circuit and graphs of values within the switching circuit according to another embodiment of the present invention.
Figure 2A:
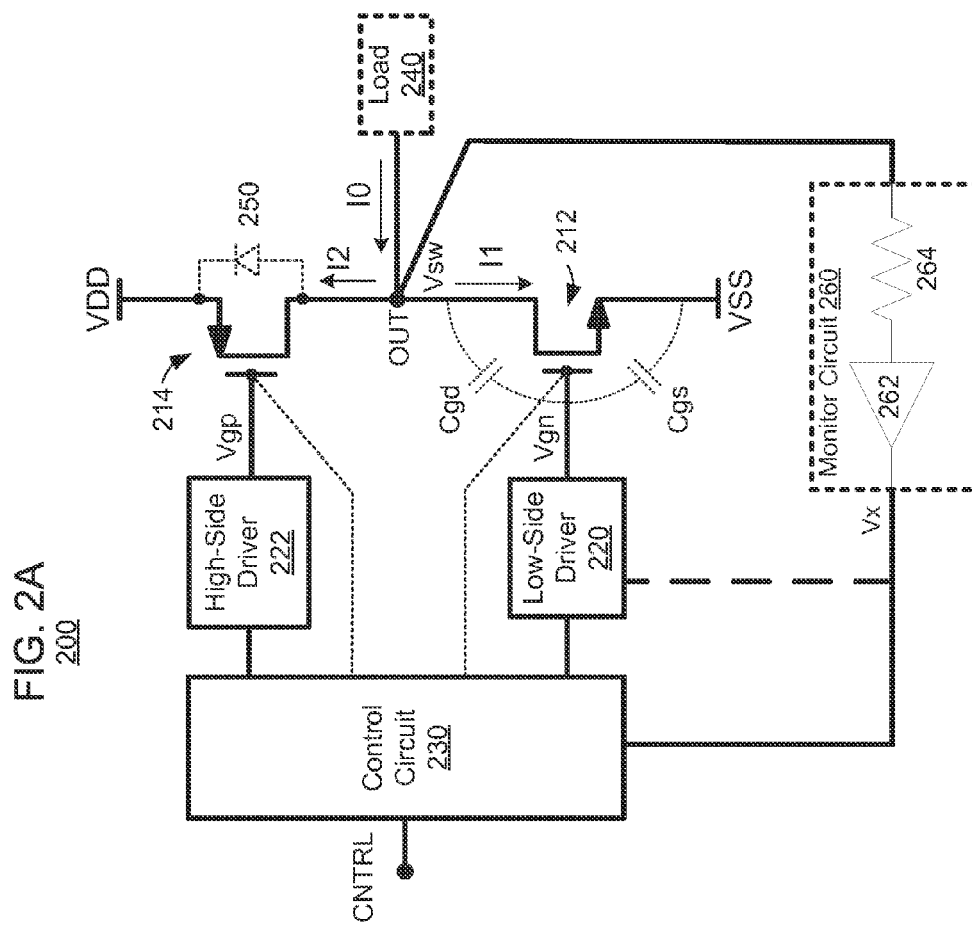

FIG. 2A illustrates an exemplary switching circuit 200 according to another embodiment of the present invention. The switching circuit 200 may include a low-side switch 212, a high-side switch 214, a low-side driver 220, a high-side driver 222 and a control circuit 230. The control circuit 230, the low-side driver 220 and the high-side driver 222 may control the low-side switch 212 and the high-side switch 214 to provide switching voltage Vsw at the output terminal OUT.

The low-side driver 220 may have a control output coupled to a control input of the low-side switch 212. The control circuit 230 may have a control output coupled to a control input of the low-side driver 220. The high-side driver 222 may have a control output coupled to a control input of the high-side switch 214. The control circuit 230 may have a control output coupled to a control input of the high-side driver 220. The switches 212, 214 may be provided in a conductive path between a pair of reference voltages, shown as VDD and VSS. The control circuit 230 and drivers 220, 222 may cooperate to control transition of the switches 212, 214 between the on state and the off state according to the two stages.

In the embodiment illustrated in FIG. 2A, the switch 212 is illustrated as an NMOS transistor, the switch 214 is illustrated as a PMOS transistor, and VDD is a voltage that is higher than VSS. In other embodiments, the low-side switch 212 and the high-side switch 214 may be any one of a p-type transistor and an n-type transistor.

As illustrated in FIG. 2A, the switch 212 may have an output terminal OUT that is coupled to switch 214 and to a load device 240. The load device 240 may be coupled to the drains of switches 214, 214. The load 240 may be an inductive load such as a speaker or a motor.

Switches 212, 214 may be a large power device, which have a switching speed that is slower than speeds of components within the control circuit 230 and drivers 220, 222. Thus, processing circuitry within the control circuit 230 and driver 220, 222 may respond to changing conditions at the output terminal OUT and control operation of the switches 212, 214 as described below. The states of the switches 212 and 214 may regulate the power at the output terminal OUT. The switching voltage Vsw at the output terminal OUT may be monitored (e.g., continuously or by sampling) by the control circuit 230 to control the operation of the low-side driver 220 and/or the high-side driver 222. The voltage Vsw may fluctuate with changing states of the switch 212, changing states of switch 214 and/or operating characteristics of the load 240.

Control voltage Vgn provided by the low-side driver 220 at the control input terminal of switch 212 may control the "on" and "off" state of the switch 212. Similarly, control voltage Vgp provided by the high-side driver 222 at the control input terminal of switch 214 may control the "on" and "off" state of the switch 214. In an n-type switch illustrated in FIG. 2, providing a high control voltage Vgn may turn "on" the switch and proving a low control voltage Vgn may turn "off" the switch.

Controlling the "on" and "off" states of the switches 212 and 214 may provide the desired switching voltage at the output terminal OUT and control the current flow via the branches formed by switches 212 and 214. For example, when switch 212 is "on" and switch 214 is "off", the output terminal OUT may be coupled to reference voltage VSS and current I0 may flow via switch 212. When switch 214 is "on" and switch 212 is "off", the output terminal OUT may be coupled to the reference voltage VDD and current I0 may flow via switch 214. Because the current I0 flowing through the load 240 may be constant, controlling the current in one of the switches 212, 214 may determine the current in the other one of the switches.

The characteristics of the control voltages Vgn and Vgp may affect the operating characteristics of the switches 212 and 214. For example, the control voltages Vgn and Vgp may affect the speed and/or efficiency of the switches 212, 214. In addition, the control voltages Vgn and Vgp may affect the characteristics of the switching waveform Vsw generated at the output terminal OUT. The timing and value of the control voltages Vgn and Vgp may help control spiking or ringing in the switching waveform Vsw which can cause unwanted noise, over-voltage stress to the devices, or Electro-Magnetic interference (EMI).

To control one or more of these characteristics while transitioning between the "on" state and the "off" state of the switches 212 or 214, the drivers 220, 222 may provide the control voltages Vgn, Vgp in two stages. For example, to control switch 212 in the first stage, the driver 220 may control the control voltage Vgn by providing a first driver strength. In the second stage, the driver 220 may control the control voltage Vgn by providing a second driver strength. The control circuit 220 may switch between the first stage and the second stage based on the voltage value Vsw at the output terminal OUT.

The voltage provided at the gate of switch 212 may be based on the driver strength (e.g., on resistance of driver 220) and the capacitance of the switch 212. During a transition from an "on" stage to an "off" stage, the driver 220 may drive the gate-to-drain capacitance Cgd of switch 212 in the first stage. In the second stage, the driver 220 may drive the gate-to-source capacitance Cgs of the switch 212. The capacitances Cgd and Cgs may have different values while the switch 212 is in the saturation region. The driver 220 may provide different driver strength during each stage of the transition between the "on" state and the "off" state of the switch 212 to control the performance of the switch 212.

FIG. 2B illustrates voltage and current graphs of the circuit 200 for transitioning from reference voltage VSS to reference voltage VDD at the output terminal OUT according to an embodiment of the present invention. During the transition switch 212 may transition from an "on" state to an "off" state and switch 214 may transition from an "off" state to an "on" state.

During period T1, the low-side driver 220 may provide a high control voltage Vgn that is sufficient to maintain the switch 212 in the "on" state. While the switch 212 is in the "on" state, current I1 may flow into switch 212 and the voltage potential VSS may be provided at the output terminal OUT. Even if the control voltage Vgn is reduced by the driver 220, the switch 212 may continue to provide a current path for current I1 while the switch 212 is in the saturation region.

During period T2, the low-side driver 220 may bring down the control voltage Vgn to a first predetermined value Vg1 to allow the voltage Vsw at the output terminal OUT to increase to a higher voltage value (e.g., reference voltage VDD). The driver 220 may hold the control voltage Vgn at the first predetermined value Vg1 during the period T2. Holding the control voltage Vgn at the first predetermined value may a discharge of the gate-to-drain capacitance Cgd (shown in phantom in FIG. 2A) of the switch 212, while allowing the current I1 to flow into the switch 212 because the switch 212 is in the saturation region. The first predetermined value Vg1 may be selected to maintain the switch 212 in saturation and to have a desired slew rate dV/dt of the voltage Vsw at the output terminal OUT. Controlling the slew rate dV/dt of the voltage Vsw may improve the efficiency and/or the EMI performance of the circuit.

During period T3, the low-side driver 220 may further reduce the value of the control voltage Vgn. Further reduction of the control voltage Vgn may reduce the current I1 flowing into the switch 212 and stop the current I1 flowing into the switch 212 when the control voltage Vgn reaches the second predetermined value Vg2. The second predetermined value Vg2 may be the threshold voltage of the switch 212. The driver 220 may control the control voltage Vgn to provide a desired gradient dI/dt of the current I1. Controlling the gradient dI/dt of the current I1 may reduce the spiking or ringing of the voltage Vsw.

Because during period T3 the driver 220 may drive the gate-to-source capacitance Cgs of the switch 212, which during saturation is different from the gate-to-drain capacitance Cgd, providing the same driver strength period T2 and T3 may quickly reduce the value of the control voltage Vg. To independently control the control voltage Vg during period T3, a different driver strength may be provided during period T3 to drive the gate-to-source capacitance Cgs.

Because current I0 flowing via the load 240 may be constant, a transition of the current flow between the low-side switch 212 and the high-side switch 214 may be included during period T3. As shown in FIG. 2B, as the current I1 is reduced, the current I2 flowing into the high-side switch 214 may be increased. Thus, the current reduction of current I1 in switch 212 may determine the current increase of current I2 in switch 214. While the high-side switch 214 may still be in the "off" state during period T3, the voltage Vsw of the output terminal OUT may have a diode forward voltage drop due to the current flow through a body diode 250 of the high side switch 214. When the high-side switch 214 is turned on, the current I2 may flow through the channel formed by the switch 214 to complete the transition of the current flow. Current I2 shown in FIG. 2B may include the current flowing via the channel of switch 214 and the body diode 250.

During period T4, the low-side driver 220 may maintain the control voltage Vgn at or below the second predetermined value Vg2 to keep the switch in the "off" state. The low side driver 220 may maintain the control voltage Vgn below the second predetermined value Vg2 when a monitor circuit in the control circuit 230 determined that the control voltages Vgn reaches the threshold voltage of the switch 212.

As discussed above, the control circuit 230 may monitor the voltage Vsw at the output terminal OUT, to select when the low-side driver 220 should switch between stage 1 and stage 2. As shown in FIG. 2B, the driver 220 may switch between stage 1 and stage 2 when the voltage Vsw at switching the output terminal OUT reaches a predetermined switching voltage Vsw_high (e.g., reference voltage VDD). The circuit 200 may include a monitor circuit 260 coupled to the output terminal OUT, to monitor the value of the voltage Vsw at the output terminal OUT. The monitor circuit 260 may provide a logic signal Vx to the control circuit 230, or optionally to the low-side driver 220, to indicate that changed value of the voltage Vsw at the output terminal OUT. The control circuit 230 and/or the low-side driver 220 may change the driving signal provided by the low-side driver 220 based on the logic signal Vx.

The monitor circuit 260 may include a resistor 264 coupled to a comparator 262. The output of the comparator 262 may be coupled to the control circuit 230 to provide the control circuit a logic signal indicating that the switching voltage Vsw has crossed a predetermined threshold voltage. The predetermined threshold voltage of the comparator 262 may be set by the on resistance of the transistor in the comparator 262. The threshold voltage may be offset to compensate for a propagation delay of the control circuit 230 and/or the driver 220. The monitor circuit 260 may be included in the control circuit 230. The resistor 264 may improve immunity over electrostatic discharge through the comparator 262 from the output terminal OUT.

As shown in FIG. 2B the control circuit 230 may monitor the control voltage value Vgn of switch 212 and/or the control voltage value Vgp of switch 214. A monitor circuit (not shown in FIG. 2B) may be included in the control circuit 230 to monitor the control voltage value Vgn and/or the control voltage value Vgp. The monitor circuit may include a comparator to compare the control voltage value Vgn or Vgp to a threshold voltage. The control circuit 230 may control the switches in the driver 220, 222 based on the values of the control voltages Vgn, Vgp. For example, the control circuit 230 may control the driver of one switch (e.g., switch 212) based on the control signal (e.g., Vgp) at the other switch (e.g., switch 214). In other embodiments, the results of the comparison of the control voltage values Vgn or Vgp to the threshold voltage may be used to maintain the switch in the off state after the threshold voltage of the switch is reached.

Figure 3A:
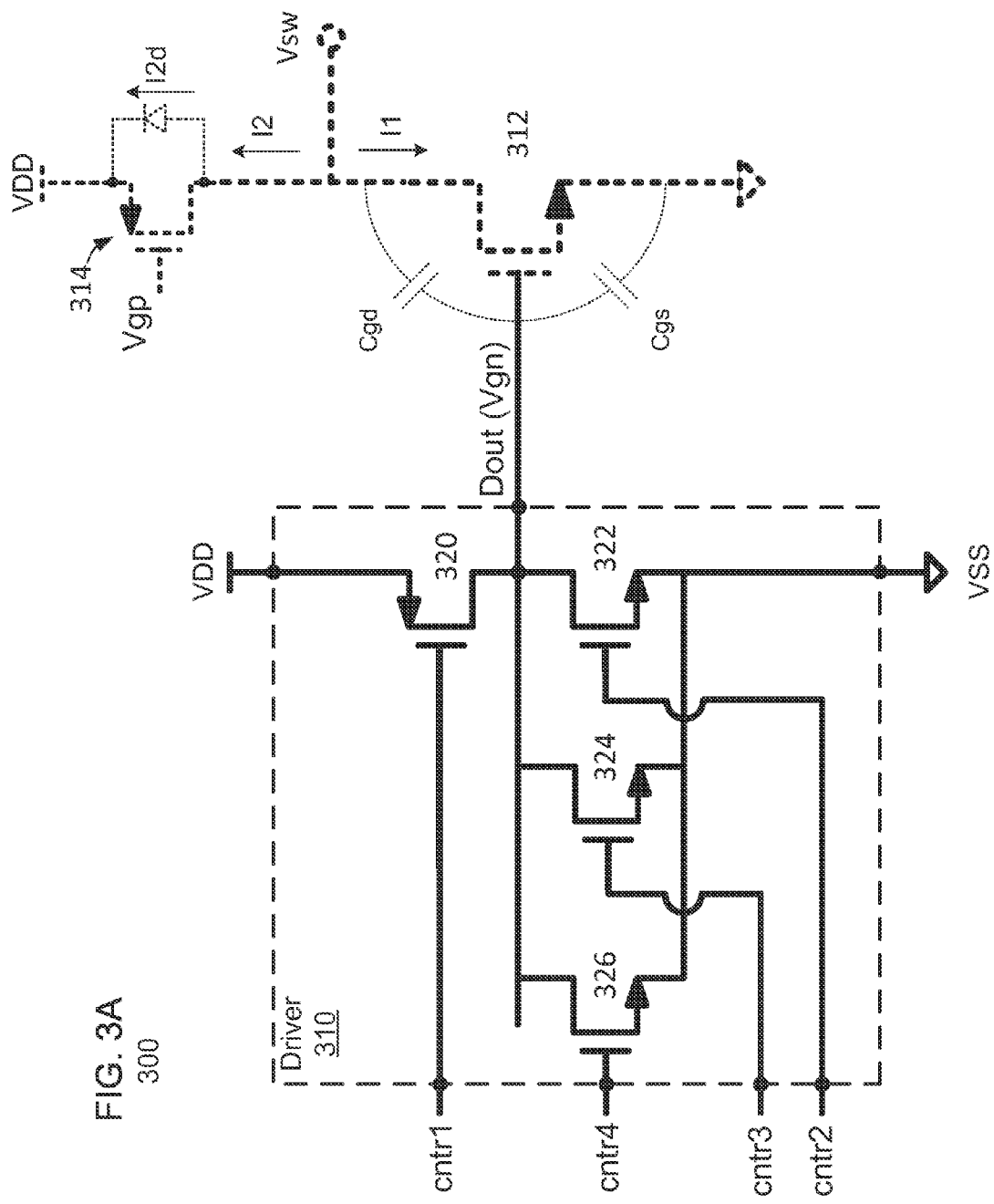
FIGS. 3A, 3B and 3C illustrate a driver circuit used to drive switches and graphs of signals associated with the driver circuit according to an embodiment of the present invention.

FIG. 3A illustrates a driver circuit 310 that may be used to provide the control signal Vgn in multiple stages to a switch according an embodiment of the present invention. The driver 310 may include a pair of complementary switches 320, 322 and one or more additional switches 324, 326. Different switches in the driver 310 may be turned on and off to provide a control voltage in multiple stages. The driver 310 may be used as the low-side driver 220 or a high side driver 222 shown in FIG. 2A.

Switches 320, 322 may be coupled to each other at an output terminal Dout. The switches 320, 322 may be coupled between a pair of reference voltages, shown as VDD and VSS. Additional switches 324, 326 may be coupled in parallel to switch 322.

In the embodiment illustrated in FIG. 3A, a p-type FET 320 and an n-type FET 322 may form the pair of complementary transistors coupled between a pair of reference voltages, shown as VDD and VSS. The drains of the complementary transistors 320, 322 may be coupled together at the output terminal Dout, the source of transistor 320 may be coupled to reference voltage VDD and the source of transistor 322 may be coupled to reference voltage VSS. Transistor 324 may be coupled in parallel to transistor 322 and may be the same type as transistor 322. Additional transistors (e.g., transistor 326) may be coupled in parallel to transistor 322. The control signal Vgn provided at the output terminal Dout may be used to drive the switch 312 coupled to the driver 310.

Control signals cntrl1-cntrl4 may be used to control the state of the switches 320-324 in the driver 310. During the process of turning on and off the switch 312, control signals cntrl1-cntrl3 may turn on and turn off transistors 320-324 to provide the needed control signal Vgn at the output terminal Dout. For example, in the embodiment illustrated in FIG. 3A, when cntrl1 and cntrl2 are both low, transistor 320 is conductive, transistor 322 is not-conductive and output control signal Vgn at output terminal Dout may be approximately equal to the reference voltage VDD. When cntrl1 and cntrl2 are both high, transistor 320 is not-conductive, transistor 322 is conductive and output control signal Vgn may be approximately equal to the reference voltage VSS.

During the transition from an "on" state to an "off" state of switch 312, the transistor 322 may be made conductive to bring the control signal Vgn to reference voltage VSS.

During the transition, other transistors (e.g., transistor 324) coupled in parallel to transistor 322 may be made conductive to change how fast the control signal Vgn is brought down to reference voltage VSS (. Thus, during the different stages of the transition from an "on" state to an "off" state of switch 312, different transistors (e.g., transistors 322, 324) may be made conductive to change the characteristics of the control signal Vgn.

For example, during stage 1 shown in FIG. 2B, transistor 322 may be made conductive to bring down the value of control signal Vgn to a first predetermined value Vg1. During stage 2, transistor 324 may be made conductive to bring down the value of the control signal Vgn to a second predetermined value Vg2. As will be discussed in more detail below, activating different transistors 322, 324 may provide a different on resistance by the driver 310. Thus, different driver strength may be provided during each of the stages. During stage 1, transistor 322 may provide a first on resistance to provide a desired voltage slew rate dV/dt of the switching voltage Vsw. During stage 2, transistor 324 may provide a second on resistance to provide a desired current gradient dI/dt of the current I1 flowing into switch 312.

During stage 1, activation of transistor 322 may pull current I1 coming into switch 312 through the gate-to-drain capacitance Cgd of switch 312. The control voltage Vgn during stage 1 may be flat because switch 312 may be in a saturation region. The voltage slew rate in the switching voltage Vsw at the switch 312 may be constant due to the constant drain-to-source voltage of transistor 322 and the constant current flowing through the gate-to-drain capacitance Cgd of switch 312 and transistor 322. The voltage slew rate in the switching voltage Vsw may be expressed as:

$$\frac{dV}{dt} = \frac{\frac{V_{gn}}{R_{on}}}{C_{gd}} \quad (1)$$

where dV/dt is the voltage slew rate, Vgn is the control voltage for switch 312, Ron is the on resistance of transistor 322 and Cgd is the gate-to-drain capacitance of switch 312. Thus, the voltage slew rate may be set by the on resistance of transistor 322.

When the transition of the switching voltage Vsw is finished (e.g., when switching voltage Vsw reaches Vdd), the control voltage Vgn may be further reduced in stage 2. During this stage, the gate-to-source capacitance Cgs of switch 312 may be discharged by transistor 324 by turning on transistor 324. As the control voltage Vgn is decreased and the gate-to-source capacitance of switch 312 is discharged, the current flowing through switch 312 may be reduced. The current gradient dI/dt of current I1 during this stage may be determined by how fast transistor 324 discharges the gate-to-source capacitance Cgs of switch 312. Thus, the on resistance of switch 312 may determine the current gradient dI/dt of switch 312.

As discussed above, the driver strength, which may be determined by the on resistance of the switches in the driver 310, may determine the voltage slew rate dV/dt in stage 1 and may determine the current gradient dI/dt of current I1 in stage 2. The voltage slew rate dV/dt may affect the efficiency and the EMI. A slower voltage slew rate dV/dt may offer better EMI performance, but there may be a trade-off between EMI performance and the efficiency of the switch. The characteristics of the transistor 322 (e.g., on-resistance) may be selected to minimize the switching loss while keeping acceptable EMI performance.

The current gradient dI/dt may affect destructive spiking of the switching voltage Vsw followed by ringing. Reducing the current gradient dI/dt may reduce or remove the spiking and/or the ringing. The characteristics of the transistor 324 (e.g., on-resistance) may be selected to reduce the current gradient dI/dt.

The on resistance provided by the driver 310 may be different in the two stages to control the dV/dt in the first stage with a first on resistance and to control the current gradient dI/dt in the second stage with a second on resistance, which is different from the first on resistance. The driver strength to achieve a reasonable voltage slew rate dV/dt of switching voltage Vsw may be stronger than the driver strength to achieve a reasonable current gradient dI/dt. In one embodiment, the driver strength provided by transistor 322 may be stronger than that driver strength provided by transistor 324. Thus, in one embodiment, the on resistance of transistor 322 may be less than the on resistance of the transistor 324.

Figure 3B:
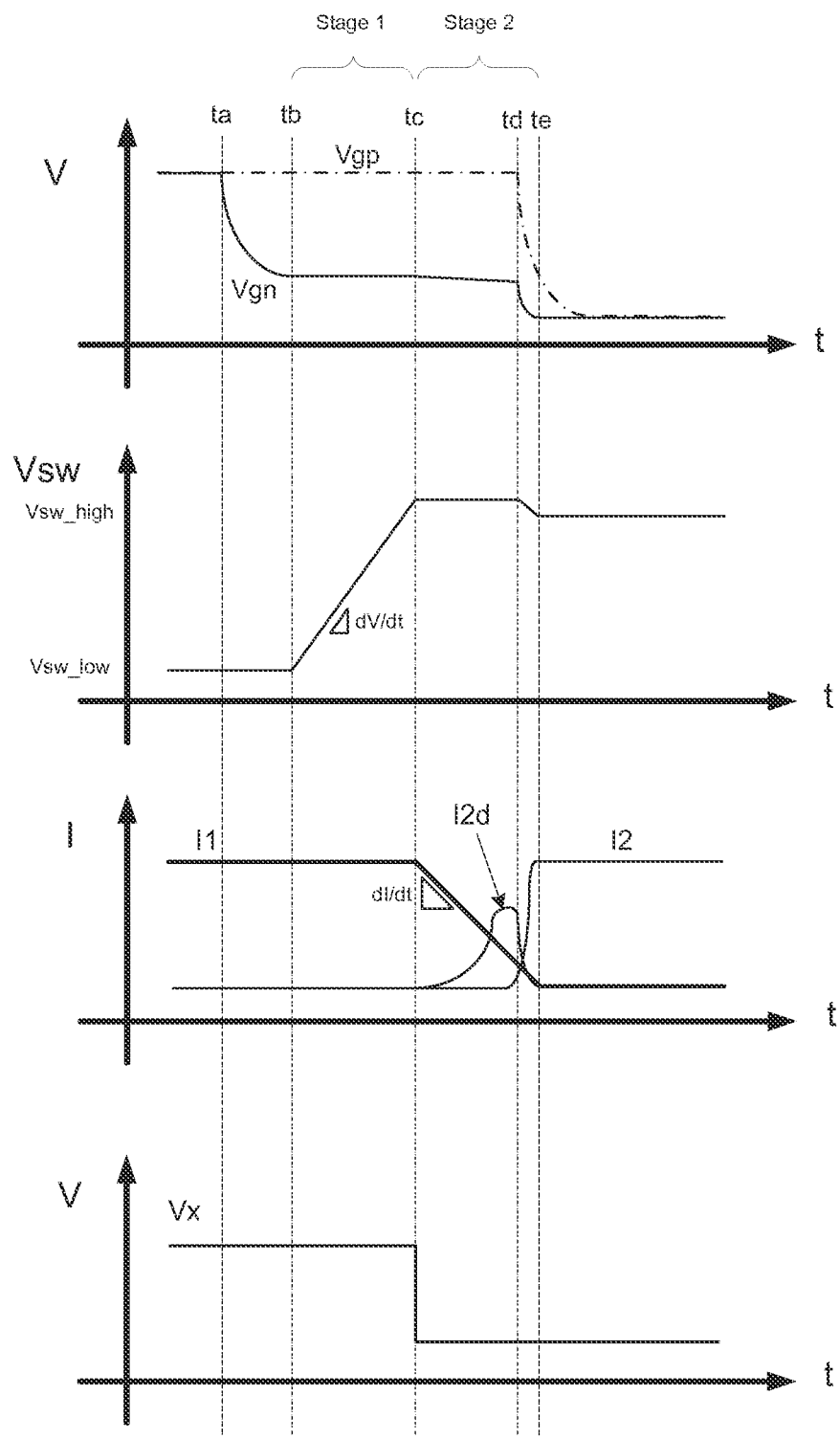

FIG. 3B illustrates voltage and current graphs of the circuit 310 according to an embodiment of the present invention. The graphs in FIG. 3B illustrate two-stage switching for voltage slew rate dV/dt of switching voltage Vsw and current gradient dI/dt of switch 312.

At time t=ta, the driver 310 may reduce the control voltage Vgn applied to the control input of switch 312. The reduction of the control voltage Vgn may begin reduction of the switching voltage Vsw at time t=tb. From time tb to tc, which may be stage 1, the control circuit may turn on transistor 322 to provide a suitable voltage slew rate dV/dt of the switching voltage Vsw. At time t=tc, a detection circuit (not shown in FIG. 3A) may detect that the switching voltage Vsw has reached a predetermined value and may provide a signal Vx to indicate that a transition can be made from stage 1 to stage 2.

At time t=tc, the control circuit may turn on transistor 324 to provide a suitable current gradient dI/dt of the switch 312. At this time, the control circuit may turn off transistor 322. As shown in FIG. 3B, as the current I1 going into switch 312 decreases, the body diode current I2d may start to increase. The body diode current I2d may continue to increase until switch 314 is turned on.

At t=td, the control voltage Vgn may be reduced to below the switch 312 threshold Vth. At this point, additional transistors (e.g., transistor) may be turned on to ensure that switch 312 stays off (e.g., in the cutoff region). After transistor 326 is turned on, transistors 322 and/or 324 may be turned off. Transistor 326 may provide a strong clamper to bind the gate of switch 312 to the source (i.e., ground) when the control voltage Vgn is below the threshold voltage. Transistor 326 may prevent switch 312 from turning on due to the coupling through parasitic capacitances of the transistors. Transistor 326 may be turned on when the control voltage Vgn reached the threshold voltage Vth. A monitor circuit in the control circuit (circuit 230 shown in FIG. 2) may be used to compare the control voltage Vgn to the threshold voltage.

At t=td, a driver for the switch 314 may turn on switch 314 by reducing the control voltage Vgp. Because turning on switch 314 may provide a channel for current flow, the body diode current I2d may start to decrease after switch 314 is turned on. Because the sum of the current going through the switch 312 and switch 314 may be constant, the current of the high side switch 314 may be automatically decided the current of the low side switch 312.

Figure 3C:
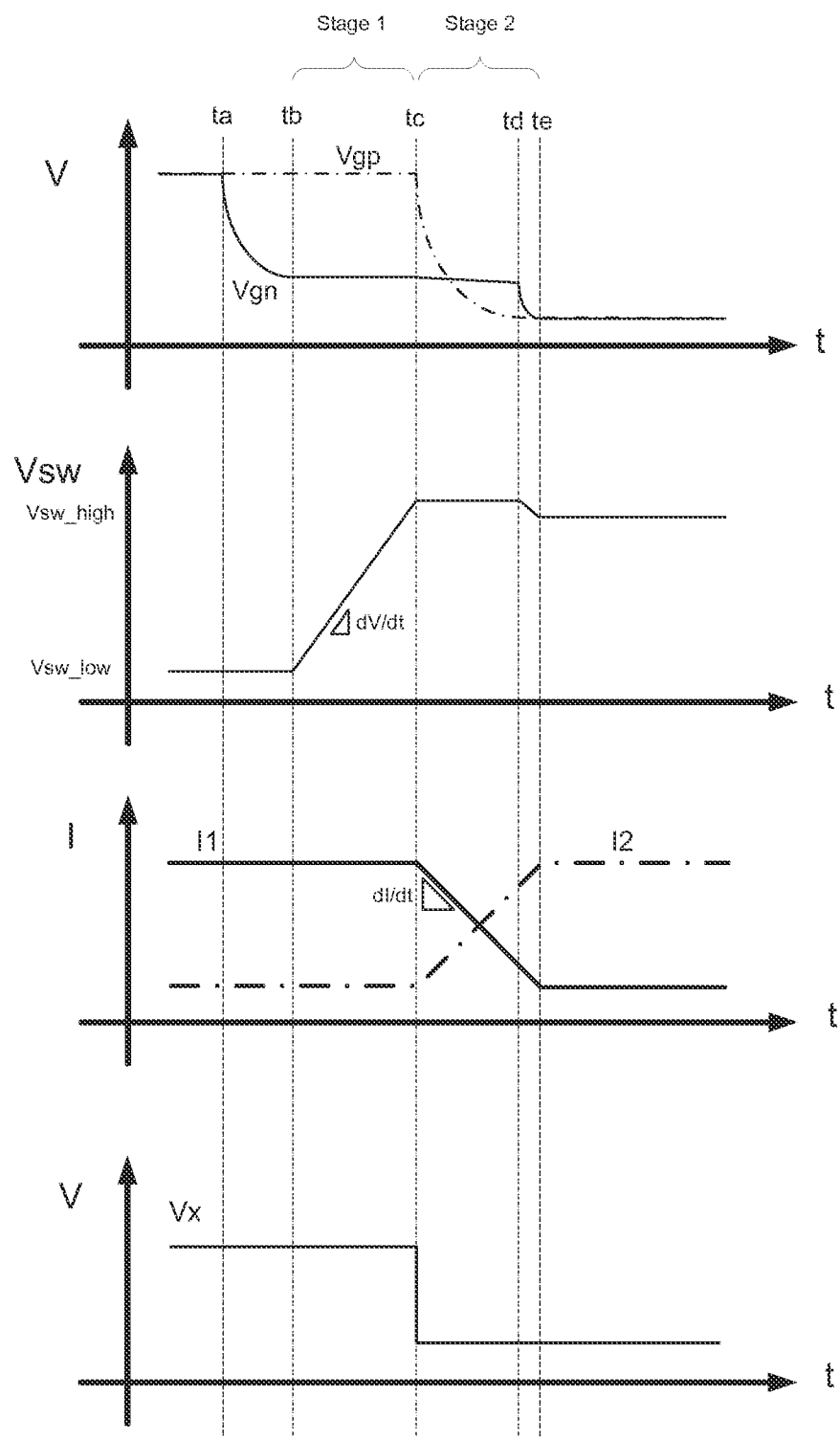

FIG. 3C illustrates voltage and current graphs of the circuit 310 according to another embodiment of the present invention. The graphs in FIG. 3C illustrate two-stage switching for voltage slew rate dV/dt of switching voltage Vsw and current gradient dI/dt of switch 312 with a reduction of the dead time. The dead time may be the time between when switch 312 is turned off and switch 314 is turned on. The dead time may be included to avoid shoot through current, which may be present when both switches 312 and 314 are on.

During the dead time, as the current I1 in switch 312 is reduced, the current may begin to flow through the body diode of switch 314 because there is still no path created by the channel of switch 314. The loss generated due to the current flowing through the body diode of switch 314 may be more than the loss generated when the current flows through the channel of the switch 314, which may depend only on the on resistance of switch 314 and the current I2.

In the embodiment shown in FIG. 3C, the dead time may be reduced by turning on switch 314 before switch 312 is completely turned off. A cross-conduction period may occur when both switches 312 and 314 are on. Thus, the control voltage Vgp provided to the switch 314 may be reduced at an earlier point in time as compared to the embodiment shown in FIG. 2B. In FIG. 3C, the control voltage Vgp may be reduced at time t=tc to turn on switch 314. Turning the switch 314 at time t=tc may reduce the body diode current Ib2 in switch 314. As the current I1 in switch 312 start to reduce at time t=tc, the switch 314 may be turned on to provide a current path for current I2 via the channel of switch 314. The timing to turn on switch 314 may be based on the value of switching voltage Vsw. When the logic signal Vx goes low, the control voltage Vgp may be reduced to turn on switch 314.

Turning on switch 314 at time t=tc may reduce the dead time, which may improve the efficiency of the circuit. In addition, because the current I2 flowing through the high-side switch 314 may be automatically decided by the tightly controlled low-side switch 312 current I1, there may be no side effects caused by the shoot through current.

Figure 4:
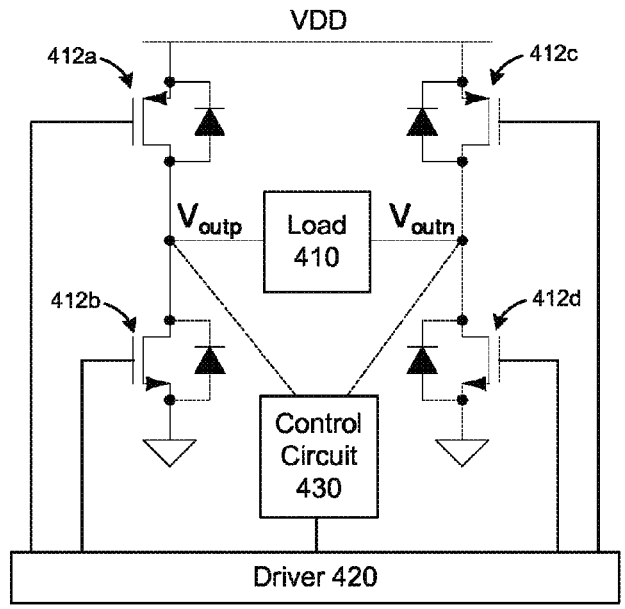
FIG. 4 illustrates a motor driver circuit that may include a driver controlled by a control circuit according to an embodiment of the present invention.

FIG. 4 illustrates a motor driver circuit 400 that may include a driver 420 controlled by control circuit 410 according to an embodiment of the present invention. The motor driver circuit 400 may be a class-D amplifier, an H-bridge, or a half bridge.

The switches 412a-d in the circuit 400 may be used to control the power provided to the load 410. The control circuit 430 may provide control signals to the driver 420 to drive one or more of the switches 412a-d in the circuit 400. The control circuit 430 may provide control signals to the driver 420 based on the switching voltages Voutp and Voutp provided to the load 410. The control circuit 430 and the driver 420 may be operated according to one or more of the embodiments discussed above for controlling the on and off state of the switches 412a-d in two stages.

As shown in the graph of FIG. 4, using the embodiments discussed above, the new method may reduce the spiking and/or the ringing of the switching voltage Voutp and/or Voutn. The spiking and/or the ringing may be reduced when the switching voltages Voutp and/or Voutn transition from a low value to a high value and transition from a high value to a low value.

Figure 5:
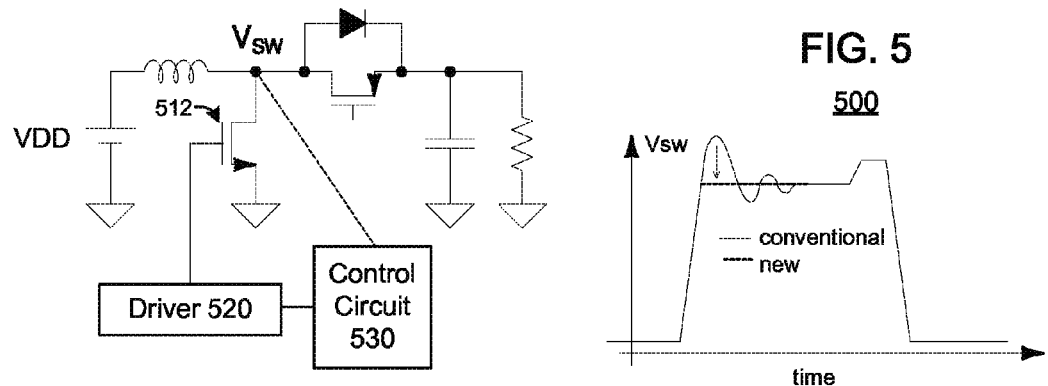
FIG. 5 illustrates a boost converter circuit that may include a driver controlled by a control circuit according to an embodiment of the present invention.

FIG. 5 illustrates a boost converter circuit 500 that may include a driver 520 controlled by control circuit 510 according to an embodiment of the present invention.

The switch in the circuit 500 may be used to provide switching voltage Vsw. The control circuit 530 may provide control signals to the driver 520 to drive the switch 512 in the circuit 500. The control circuit 530 may provide control signals to the driver 520 based on the switching voltage Vsw. The control circuit 530 and the driver 520 may be operated according to one or more of the embodiments discussed above for controlling the on and off state of the switch 512 in two stages.

As shown in the graph of FIG. 5, using the embodiments discussed above, the new method may reduce the spiking and/or the ringing of the switching voltage Vsw.

Figure 6:
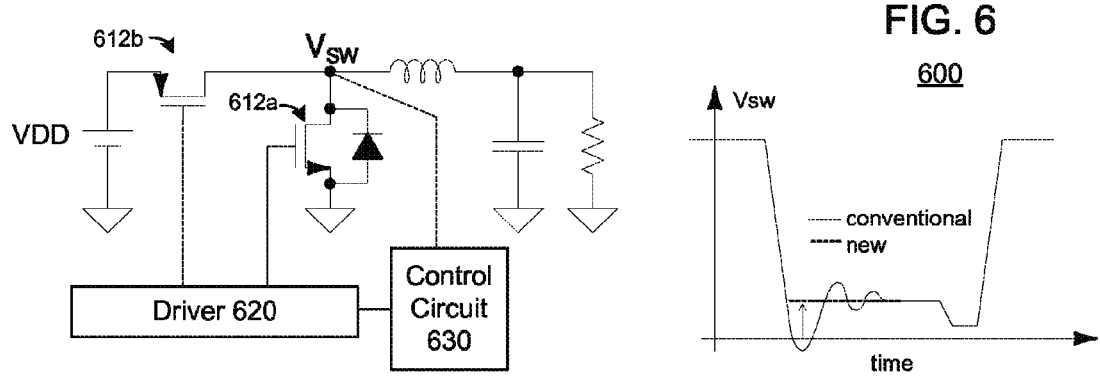
FIG. 6 illustrates a buck converter circuit that may include a driver controlled by a control circuit according to an embodiment of the present invention.

FIG. 6 illustrates a buck converter circuit 600 that may include a driver 620 controlled by control circuit 610 according to an embodiment of the present invention.

The switch in the circuit 600 may be used to provide switching voltage Vsw. The control circuit 630 may provide control signals to the driver 620 to drive one or more of the switches 612a, 612b in the circuit 600. The control circuit 630 may provide control signals to the driver 620 based on the switching voltage Vsw. The control circuit 530 and the driver 620 may be operated according to one or more of the embodiments discussed above for controlling the on and off state of the switches 612a, 612b in two stages.

As shown in the graph of FIG. 6, using the embodiments discussed above, the new method may reduce the spiking and/or the ringing of the switching voltage Vsw.

As will be understood by one skilled in the pertinent arts, the switch configurations or operations described herein are not limited to the specific transistors depicted and described but are applicable to various transistor technologies including NMOS, PMOS, NDMOS, PDMOS and bipolar junction transistors.

In the embodiment discussed above, the reference voltage VSS may be ground, a negative supply voltage, or a lowest negative supply voltage. The reference voltage VDD may be a power supply, a positive supply voltage, or a highest positive supply voltage.

In the above description, for purposes of explanation, numerous specific details have been set forth in order to provide a thorough understanding of the inventive concepts. As part of this description, some structures and devices may have been shown in block diagram form in order to avoid obscuring the invention. Reference in the specification to "one embodiment" or "an embodiment" means that a particular feature, structure, or characteristic described in connection with the embodiment is included in at least one embodiment of the invention, and multiple references to "one embodiment" or "an embodiment" should not be understood as necessarily all referring to the same embodiment.

One or a plurality of the above illustrated operations described herein may be implemented in a computer program that may be stored on a storage medium having instructions to program a system to perform the operations. The storage medium may include, but is not limited to, any type of disk including floppy disks, optical disks, compact disk read-only memories (CD-ROMs), compact disk rewritable (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions. Other embodiments may be implemented as software modules executed by a programmable control device.

As used in any embodiment in the present disclosure, "circuitry" may comprise, for example, singly or in any combination, analog circuitry, digital circuitry, hardwired circuitry, programmable circuitry, state machine circuitry, and/or firmware that stores instructions executed by programmable circuitry. Also, in any embodiment herein, circuitry may be embodied as, and/or form part of, one or more integrated circuits.

Although the methods illustrated and described herein include series of steps, it will be appreciated that the different embodiments of the present disclosure are not limited by the illustrated ordering of steps, as some steps may occur in different orders, some concurrently with other steps apart from that shown and described herein. In addition, not all illustrated steps may be required to implement a methodology in accordance with the present invention. Moreover, it will be appreciated that the processes may be implemented in association with the apparatus and systems illustrated and described herein as well as in association with other systems not illustrated.

It will be appreciated that in the development of any actual implementation (as in any development project), numerous decisions must be made to achieve the developers' specific goals (e.g., compliance with system and business related constraints), and that these goals will vary from one implementation to another. It will also be appreciated that such development efforts might be complex and time consuming, but would nevertheless be a routine undertaking for those of ordinary skill in art having the benefit of this disclosure.

What is claimed is:

1. A circuit to reduce spiking or ringing at an output terminal, the circuit comprising:
   a switch coupled to the output terminal;
   a driver circuit coupled to a control input of the switch to provide a control signal thereto; and
   a control circuit coupled to the driver circuit to cause the driver circuit to provide the control signal to the switch in multiple stages for a single transition from an on state to an off state of the switch based on a voltage at the output terminal, the driver circuit providing a first driver strength in a first stage of the multiple stages of the control signal and a second driver strength in a second stage of the multiple stages of the control signal after the first stage, the first driver strength being greater than the second driver strength.

2. The circuit of claim 1, wherein the control circuit controls the driver circuit to transition from the first stage providing the first driver strength to the second stage providing the second driver strength in response to the voltage at the output terminal reaching a predetermined value.

3. The circuit of claim 2, further comprising:
   a second switch coupled to the output terminal; and
   a second driver circuit coupled to a control input of the second switch to provide a second control signal to control a transition from an off state to an on state of the second switch, wherein the second driver circuit provides the second control signal to transition from the off state to the on state of the second switch in response to the voltage at the output terminal reaching the predetermined value and in synchronization with the driver circuit providing the control signal to transition from the on state to the off state of the switch.

4. The circuit of claim 1, wherein the control circuit includes a comparator to compare the voltage at the output terminal to a predetermined value and the control circuit controls the driver circuit to transition from the first stage providing the first driver strength to the second stage providing the second driver strength based on an output signal of the comparator.

5. A circuit to reduce spiking or ringing at an output terminal, the circuit comprising:
   a switch coupled to the output terminal;
   means for driving a control signal onto a control input of the switch; and
   means for controlling the means for driving to drive the control signal onto the switch in multiple stages for a single transition from an on state to an off state of the switch based on a voltage at the output terminal, the means for driving providing the control signal at a first driver strength in a first stage of the multiple stages and at a second driver strength in a second stage of the multiple stages after the first stage, the first driver strength being greater than the second driver strength.

6. The circuit of claim 5, wherein the means for controlling controls the means for driving to change from the first stage to the second stage when the voltage at the output terminal reaches a predetermined value.

7. The circuit of claim 6, further comprising:
   a second switch coupled to the output terminal; and
   a second means for driving coupled to a control input of the second switch to provide a second control signal to control a transition from an off state to an on state of the second switch, wherein the second means for driving provides the second control signal to transition from the off state to the on state of the second switch in response to the voltage at the output terminal reaching the predetermined value and in synchronization with the means for driving the control signal to transition from the on state to the off state of the switch.

8. The circuit of claim 5, wherein the means for controlling includes a means for comparing the voltage at the output terminal to a predetermined value and controls the means for driving to change from the first stage to the second stage based on an output signal of the means for comparing.

9. A circuit to reduce spiking or ringing at an output terminal, the circuit comprising:
   a switch coupled to the output terminal;
   a driver circuit coupled to a control input of the switch to provide a control signal thereto, the driver circuit including first and second driver transistors having drains coupled to the switch, the first and second driver transistors having different sizes; and
   a control circuit coupled to the driver circuit to cause the driver circuit to provide the control signal in multiple stages based on a voltage at the output terminal, in a first stage the control circuit activating the first driver transistor to provide the control signal and in a second stage the control circuit activating the second driver transistor to provide the control signal.

10. The circuit of claim 9, wherein the driver circuit provides the control signal in the multiple stages to perform a single transition from an on state to an off state of the switch.

11. The circuit of claim 9, wherein the control circuit controls the driver circuit to change from the first stage to the second stage in response to the voltage at the output terminal reaching a predetermined value.

12. The circuit of claim 11, further comprising:
   a second switch coupled to the output terminal; and
   a second driver circuit coupled to a control input of the second switch to provide a second control signal to control the transition from an off state to an on state of the second switch, wherein the second driver circuit provides the second control signal to transition from the off state to the on state of the second switch in response to the voltage at the output terminal reaching the predetermined value and in synchronization with the driver circuit providing the control signal to transition from an on state to an off state of the switch.

13. The circuit of claim 9, wherein the control circuit includes a comparator to compare the voltage at the output terminal to a predetermined value and the control circuit controls the driver circuit to change from the first stage to the second stage based on an output signal of the comparator.

14. The circuit of claim 9, wherein the first driver transistor has a first on-resistance that is lower than a second on-resistance of the second driver transistor.

15. A circuit, comprising:
a switch coupled to an output terminal;
a driver circuit coupled to a control input of the switch to provide a control signal thereto, wherein the driver circuit includes:
a pair of complementary transistors having drains coupled to the switch, a first transistor in the pair coupling the driver circuit terminal to a first reference voltage when activated and a second transistor in the pair coupling the driver circuit terminal to a second reference voltage when activated; and
a third transistor having a source coupled to a source of the second transistor and having a drain coupled to the drain of the second transistor, the third transistor coupling the driver circuit terminal to the second reference voltage when activated and having an on-resistance that is higher than an on-resistance of the second transistor; and
a control circuit coupled to the driver circuit to cause the driver circuit to provide the control signal in multiple stages based on a voltage at the output terminal.

16. The circuit of claim 15, wherein in a first stage of the multiple stages the second transistor is activated and the third transistor is not activated, and in a second stage of the multiple stages the third transistor is activated and the second transistor is not activated.

17. The circuit of claim 1, wherein the driver circuit provides different driver strengths in each of the stages of the control signal by presenting different impedances to the switch in each of the stages.

18. The circuit of claim 17, wherein the driver circuit presents a first impedance to the switch in the first stage of the control signal and a second impedance to the switch in the second stage of the control signal after the first stage, the second impedance being greater than the first impedance.

19. The circuit of claim 5, wherein the driver circuit provides the control signal in the first stage at the first driver strength to set a slew rate of the voltage at the output terminal.

20. The circuit of claim 15, wherein the driver circuit provides the control signal to the switch in multiple stages to perform a single transition from an on state to an off state of the switch.

21. The circuit of claim 1, wherein the driver circuit includes first and second driver transistors having drains coupled to the switch, the first and second driver transistors having different output impedances providing the different driver strengths in each of the stages.

22. The circuit of claim 21, wherein the first and second driver transistors are of the same transistor type.

23. The circuit of claim 21, wherein the first and second driver transistors are of different sizes.

24. The circuit of claim 21, wherein a gate of the first driver transistor is configured to receive a first signal from the control circuit to cause the driver circuit to provide the control signal in the first stage, and a gate of the second driver transistor is configured to receive a second signal from the control circuit to cause the driver circuit to provide the control signal in the second stage.

25. The circuit of claim 1, wherein the switch includes a transistor, and the control signal has a value above a threshold voltage of the transistor during the multiple stages.

26. The circuit of claim 1, wherein the control circuit causes the driver circuit to provide a first value of the control signal during the first stage and a second value of the control signal during the second stage, the second value being less than the first value but greater than a threshold voltage of the switch.

27. The circuit of claim 1, wherein the output terminal is coupled to an inductive load.

28. The circuit of claim 5, wherein the output terminal is coupled to an inductive load.

29. The circuit of claim 9, wherein the output terminal is coupled to an inductive load.

30. The circuit of claim 5, wherein the means for driving provides the first driver strength in the first stage of the control signal by presenting a first impedance to the switch and provides the second driver strength in the second stage of the control signal by presenting a second impedance to the switch, the second impedance being greater than the first impedance.

31. The circuit of claim 5, wherein the means for driving includes first and second driver transistors of the same transistor type having drains coupled to the switch.

32. The circuit of claim 31, wherein the first and second driver transistors have different output impedances to provide the different driver strengths in each of the stages.

* * * * *